(12) United States Patent
Hermes

(10) Patent No.: US 7,030,499 B2
(45) Date of Patent: Apr. 18, 2006

(54) SEMICONDUCTOR CONSTRUCTIONS

(75) Inventor: Michael J. Hermes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/999,769

(22) Filed: Nov. 29, 2004

(65) Prior Publication Data
US 2005/0095853 A1 May 5, 2005

Related U.S. Application Data

(63) Continuation of application No. 10/454,303, filed on Jun. 3, 2003, now Pat. No. 6,828,238.

(51) Int. Cl.
H01L 23/48 (2006.01)

(52) U.S. Cl. ..................... 257/774; 438/666
(58) Field of Classification Search ............... 257/368, 257/369, 379, 760, 774; 438/200, 233, 624, 438/666, 675
See application file for complete search history.

(56) References Cited

U.S. PATENT DOCUMENTS

| 5,362,666 | A | 11/1994 | Dennison |
| 5,498,570 | A | 3/1996 | Becker |
| 5,753,565 | A | 5/1998 | Becker |
| 5,907,781 | A | 5/1999 | Chen et al. |
| 6,271,125 | B1 * | 8/2001 | Yoo et al. .................. 438/637 |
| 6,300,178 | B1 | 10/2001 | Sunouchi |
| 6,423,627 | B1 | 7/2002 | Carter et al. |

* cited by examiner

Primary Examiner—David Vu
(74) Attorney, Agent, or Firm—Wells St. John P.S.

(57) ABSTRACT

The invention includes methods of forming openings extending through electrically insulative layers to electrically conductive materials. In an exemplary aspect, a substrate is provided which supports a stack and an electrical node. The stack comprises an electrically insulative cap over an electrically conductive material. An electrically insulative layer is formed over the stack and over the electrical node. A first etch is utilized to etch through the electrically insulative layer to the electrical node and to the electrically insulative cap. The first etch etches partially into the electrically insulative cap but does not etch entirely through the electrically insulative cap. A second etch is utilized after the first etch to etch entirely through the electrically insulative cap to the electrically conductive material of the stack.

12 Claims, 7 Drawing Sheets

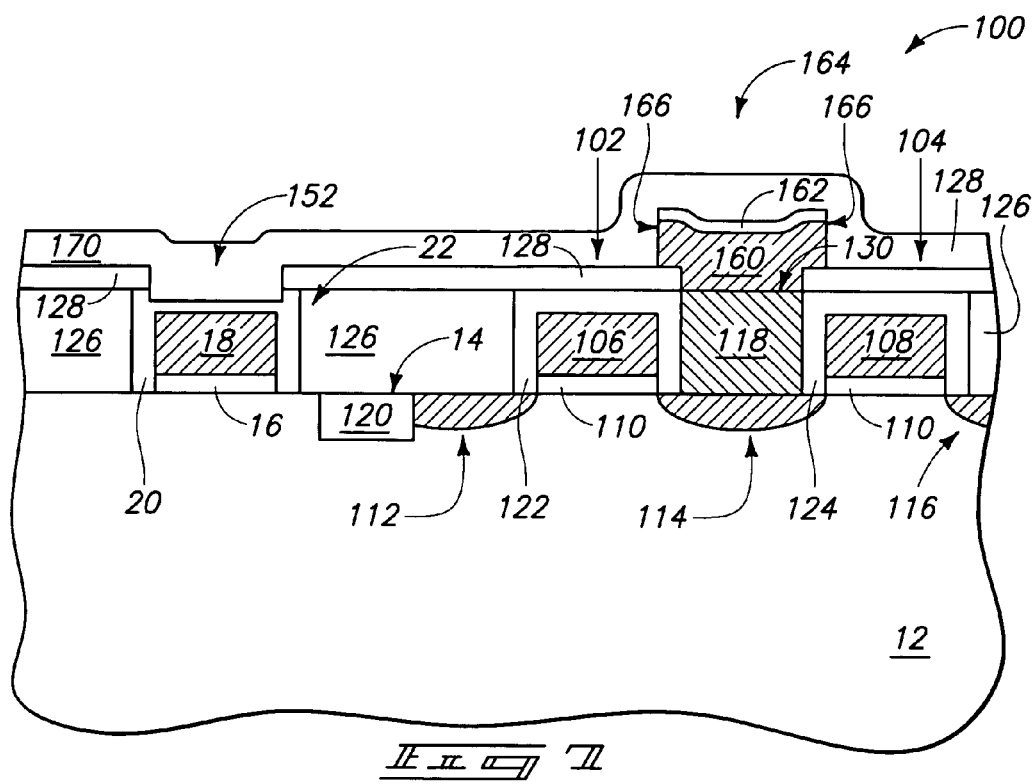
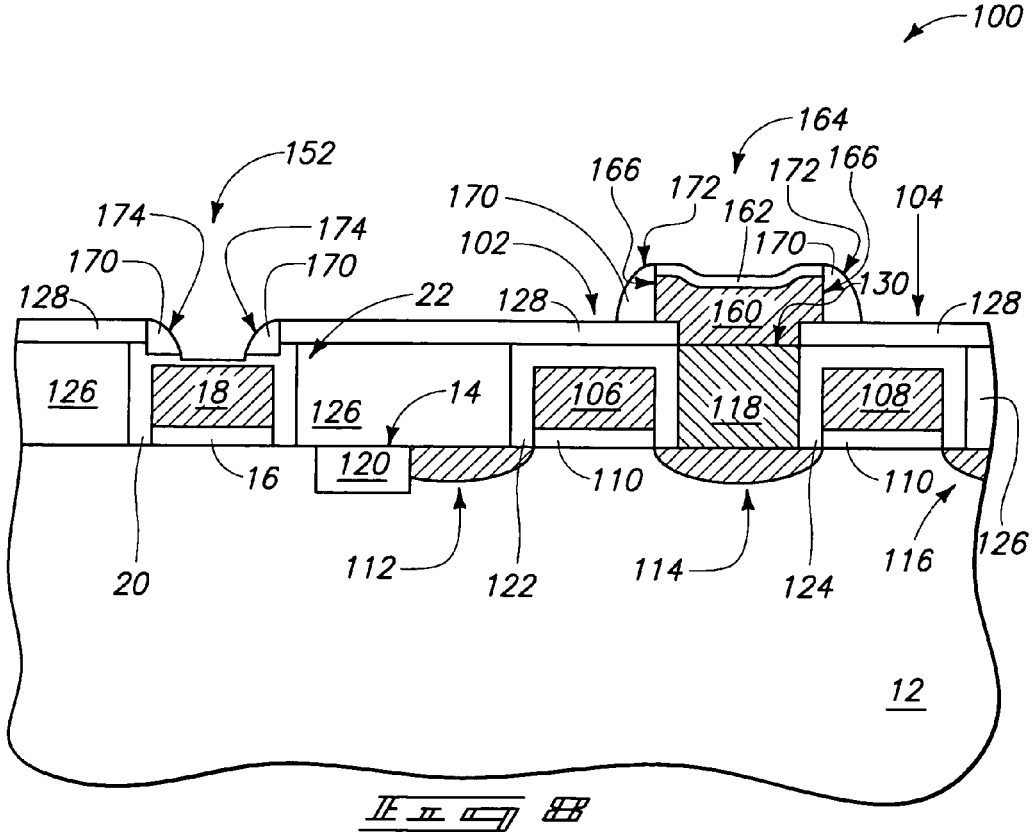

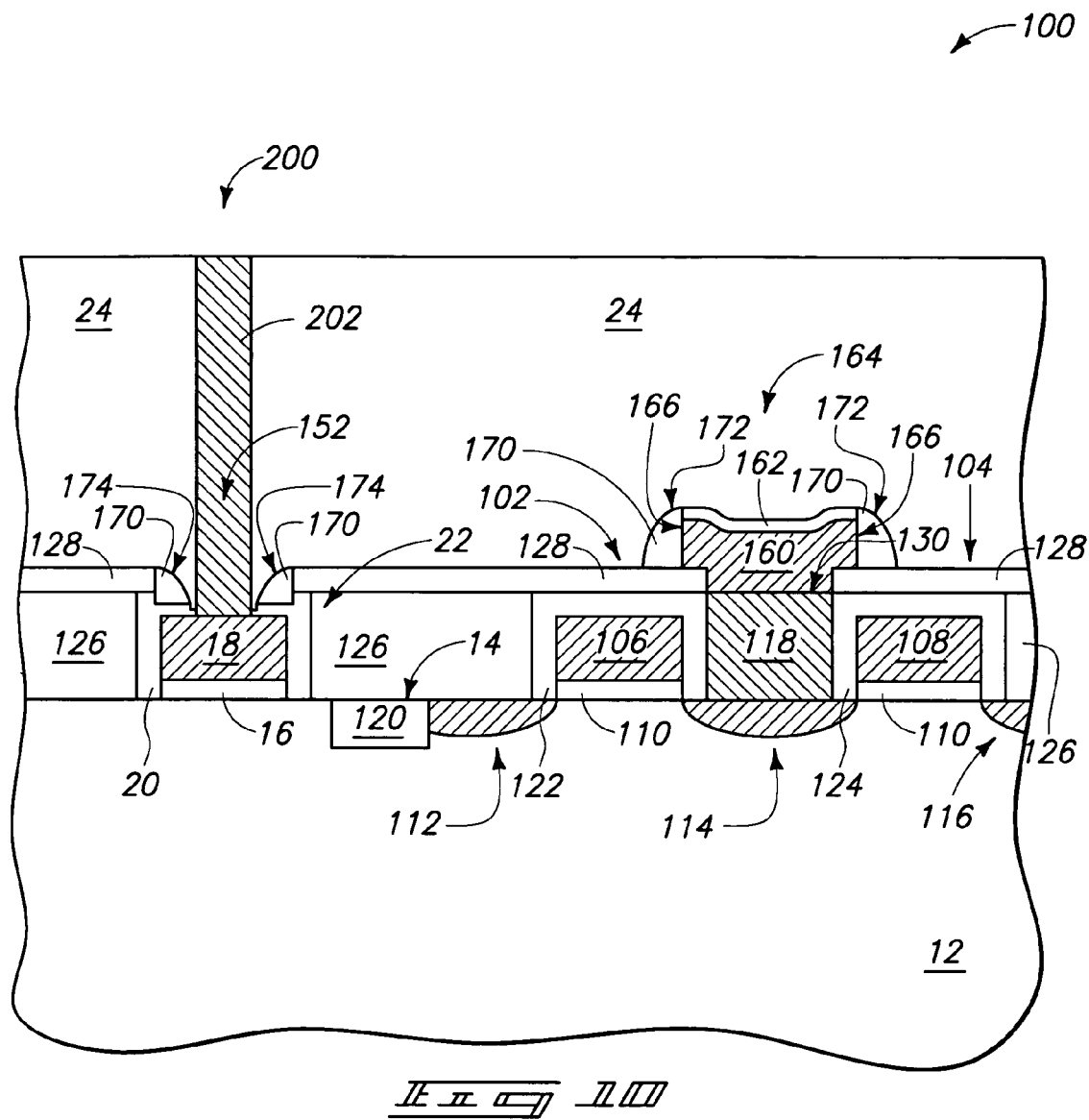

SEMICONDUCTOR CONSTRUCTIONS

RELATED PATENT DATA

This application is a continuation of U.S. patent application Ser. No. 10/454,303, which was filed on Jun. 3, 2003 now U.S. Pat. No. 6,828,238.

TECHNICAL FIELD

The invention pertains to methods of forming openings through electrically insulative caps to electrically conductive materials.

BACKGROUND OF THE INVENTION

Various semiconductor constructions comprise an insulative cap stacked over a conductive material. For instance, wordlines and bitlines typically comprise conductive materials patterned as lines extending across a semiconductor substrate, and protected by electrically insulative caps formed over the electrically conductive lines.

It is frequently desired to form openings extending through the protective cap to the conductive material beneath the cap. For instance, it can be desired to form an electrical interconnect extending to the electrically conductive material of a wordline or bitline. This is commonly accomplished by forming an opening extending through an electrically insulative protective cap to expose electrically conductive material of the wordline or bitline, and subsequently filling the opening with an electrically conductive material to form the electrical interconnect to the conductive material of the wordline or bitline.

A prior art process for forming an electrical interconnect to conductive material of a line is described with reference to FIGS. 1 and 2. Referring initially to FIG. 1, a semiconductor construction 10 includes a substrate 12 having an upper surface 14. Substrate 12 can comprise, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A thin layer of electrically insulative material 16 is formed over upper surface 14, and an electrically conductive line 18 is formed over insulative material 16. Insulative material 16 can comprise, for example, silicon dioxide. The electrically conductive material of line 18 can comprise, for example, one or more materials selected from the group of metals, metal compounds and conductively-doped silicon. Although line 18 is shown having a homogeneous cross section, it is to be understood that the line can comprise a stack of one or more electrically conductive layers of differing composition relative to one another. Line 18 would have a length extending into and out of the page relative to the FIG. 1 cross-sectional view.

A protective material 20 is formed around electrically conductive line 18. Protective material 20 is typically an electrically insulative material, and can comprise, consist essentially of, or consist of silicon nitride. A stack 22 can be considered to comprise protective material 20, line 18 and insulative material 16. The protective material 20 can extend around three sides of conductive material 18 in the stack (as shown), br, in other aspects (not shown) can be only over the top of material 18.

A thick mass of electrically insulative material 24 is formed over stack 22, as well as over surface 14 of substrate 12. Mass 24 can comprise, for example, a silicate glass (such as, for example, borophosphosilicate glass (BPSG)). Mass 24 can be homogeneous, or can comprise a stack of electrically insulative materials. Mass 24 will typically comprise a thickness over stack 22 of at least about 10,000 Å, frequently at least about 15,000 Å, and even at least about 20,000 Å.

A patterned masking material 26 is formed over mass 24. Masking material 26 can comprise, for example, photoresist, and can be patterned utilizing photolithographic processing. Patterned masking material 26 defines an opening 28 extending through the patterned masking material and to an upper surface of mass 24.

Referring to FIG. 2, opening 28 is extended through mass 24, through protective material 20, and to an upper surface of conductive material 18, utilizing a suitable etch. If mass 24 consists of a silicate glass, and protective material 20 consists of silicon nitride, a suitable etch for forming opening 28 can be an etch utilizing $CF_4$.

A problem which occurs during formation of opening 28 is that even though etches are known which can etch both a silicate glass of mass 24 and a silicon nitride material of protective layer 20, the etches will frequently be slower relative to a silicon nitride material than to a silicate glass. Accordingly, the downward progression of the etch slows once the etch reaches protective material 20. The etch can then start to extend laterally outward which forms a widened region 30 of opening 28.

A continuing goal of semiconductor processing is to reduce dimensions associated with circuit components to enable an increase in packing density of the components. Ultimately, a conductive interconnect is to be formed in opening 28, and the widening of opening 28 confers an increased lateral dimension to the electrical interconnect. Such increased lateral dimension reduces a packing density that can be achieved. Accordingly, it is desired to develop new methods for forming openings which alleviate or prevent the widening associated with prior art processes.

SUMMARY OF THE INVENTION

The invention includes a method of forming an opening extending through an electrically insulative cap to an electrically conductive material. A substrate is provided. The substrate supports a stack and an electrical node. The stack includes an electrically insulative cap over an electrically conductive material. An electrically insulative layer is formed over the stack and over the electrical node. A first etch is utilized to etch through the electrically insulative layer to the electrical node and to the insulative cap. The first etch etches partially into the electrically insulative cap but does not etch entirely through the electrically insulative cap. A second etch is conducted after the first etch, and is utilized to etch entirely through the electrically insulative cap to the conductive material of the stack.

In another aspect, the invention includes a method of forming an opening through a silicon nitride-containing cap to an electrically conductive material. A substrate is provided, and the substrate supports a wordline stack and an electrical node. The stack comprises a silicon nitride-containing cap over an electrically conductive material. A first electrically insulative layer is formed over the stack and over the electrical node. A first etch is utilized to etch through the first electrically insulative layer to the electrical node and to the silicon nitride-containing cap. The first etch also etches partially into the silicon-nitride-containing cap, but does not etch entirely through the cap. The partial etching of the first etch into the silicon nitride-containing cap forms a first opening extending into the cap to a first depth. A second electrically insulative layer is formed within the first opening in the cap. The second electrically insulative layer is anisotropically etched to form, in at least one cross-sectional view, separated spacers within the first opening in the silicon nitride-containing cap. An electrically insulative material is formed over the stack, within the first opening, and over the separated spacers. The electrically insulative material has a total thickness of at least about 10,000 Å. A second etch is utilized to form a second opening which extends through the electrically insulative material, between the separated spacers, through the silicon nitride-containing cap, and to the electrically conductive material of the stack.

BRIEF DESCRIPTION OF THE DRAWINGS

Preferred embodiments of the invention are described below with reference to the following accompanying drawings.

FIG. 7 is a view of the FIG. 3 wafer fragment shown at a processing stage subsequent to that of FIG. 6.

FIG. 8 is a view of the FIG. 3 wafer fragment shown at a processing stage subsequent to that of FIG. 7.

FIG. 10 is a view of the FIG. 3 wafer fragment shown at a processing stage subsequent to that of FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect, the invention includes recognition that the problems described in the "Background" section of this disclosure associated with the etching of a silicon nitride-containing cap can be alleviated, and even prevented, if the thickness of the cap is reduced prior to the etch utilized to penetrate the cap. Accordingly, the invention incorporates exposure of a silicon nitride cap to one or more etching processes which reduce a thickness of the cap prior to the etch ultimately utilized to penetrate through the cap. The etching processes utilized to reduce the thickness of the cap can be etching processes typically utilized during fabrication of circuit elements peripheral to the cap, and accordingly can be readily incorporated into existing semiconductor fabrication processes.

Exemplary aspects of the present invention are described with reference to FIGS. 3–10. In referring to FIGS. 3–10, identical numbering will be utilized as was utilized above in describing the prior art in the "Background" section of this disclosure, where appropriate.

Figure 3:
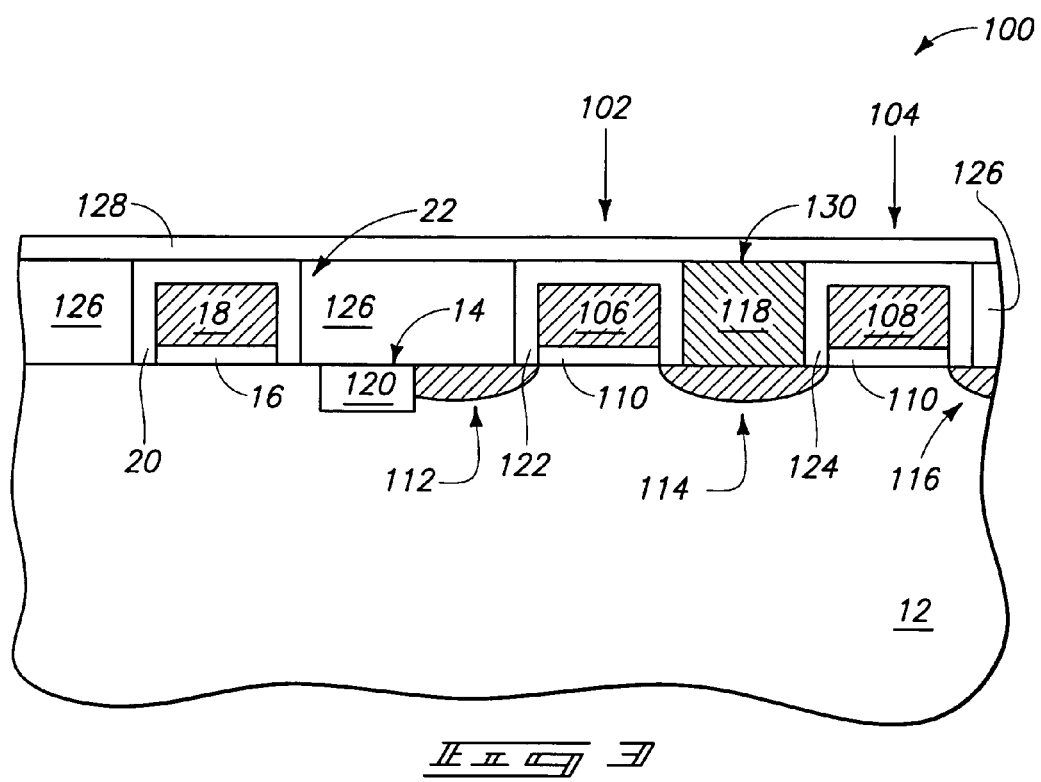
FIG. 3 is a diagrammatic, cross-sectional view of a semiconductor wafer fragment shown at a preliminary processing stage of an exemplary aspect of the present invention.

Referring initially to FIG. 3, a semiconductor construction 100 is illustrated. Construction 100 comprises a substrate 12 having an upper surface 14. Substrate 12 can comprise, for example, monocrystalline silicon, as described previously in the "Background" section of this disclosure.

A stack 22 is formed over upper surface 14 of substrate 12. Stack 22 comprises insulative material 16, conductive material 18, and protective cap 20, as described previously in the "Background" section of this disclosure. Stack 22 can be, for example, a wordline stack, with the wordline extending into and out of the page relative to the cross-sectional view of FIG. 3.

Construction 100 further comprises several circuit elements peripheral to stack 22. In the shown aspect of the invention, construction 100 comprises a pair of transistor devices 102 and 104. The transistor devices include conductive transistor gates 106 and 108, which are separated from upper surface 14 of substrate 12 by dielectric material 110. The dielectric material 110 can comprise, for example, silicon dioxide. Electrically conductive gates 106 and 108 can comprise conventional constructions, and accordingly can comprise one or more metals, metal compounds, and/or conductively-doped silicon.

Transistor device 102 includes source/drain regions 112 and 114 extending into substrate 12. The source/drain regions can comprise conductively-doped regions of a semiconductor material, for example. Transistor device 104 comprises the source/drain region 114, and a source/drain region 116.

A bitline contact 118 is formed over and in electrical connection with source/drain region 114. Bitline contact 118 can comprise any suitable conductive material including, for example, metals, metal compounds, and/or conductively-doped silicon.

An isolation region 120 is shown extending within substrate 12 and adjacent source/drain region 112. Isolation region 120 can comprise a conventional construction, and accordingly can comprise, for example, a shallow trench isolation region filled with suitable electrically insulative material, such as, for example, silicon dioxide.

Ultimately, transistor devices 102 and 104 will be incorporated into a DRAM construction. Accordingly, source/drain regions 112 and 116 will ultimately be electrically connected with storage devices (not shown) such as, for example, capacitor constructions. The storage devices can be formed before or after the processing stage of FIG. 3, and can be formed in accordance with conventional methodologies.

A protective cap 122 extends around conductive gate material 106, and another protective cap 124 extends around conductive gate material 108. Protective caps 122 and 124 can comprise conventional materials, such as, for example, silicon nitride.

An electrically insulative material 126 extends over substrate 12, and between stack 22 and transistor device 102.

Electrically insulative material 126 can comprise any suitable material, including, for example, a silicate glass, such as BPSG.

An electrically insulative layer 128 is formed over stack 22, and also over transistor devices 102 and 104. Electrically insulative layer 128 can comprise any suitable electrically insulative material, and in typical applications can comprise, consist essentially of, or consist of silicon dioxide. The silicon dioxide of layer 128 can be formed by, for example, chemical vapor deposition (CVD) utilizing tetraethyl orthosilicate (TEOS).

In subsequent processing (described below) an opening is to be formed through material 128 so that a material can be formed in electrical contact with pedestal 118. Pedestal 118 can thus be considered an electrical node to which electrical contact is ultimately to be made. Pedestal 118 comprises an upper surface 130, and in some aspects of the invention, the upper surface 130 can be considered the actual location of the electrical node to which electrical contact is ultimately to be made.

In the shown aspect of the invention, material 126, pedestal 118, and electrically insulative caps 20, 122 and 124 are shown forming a substantially planar upper surface extending over substrate 12. Such substantially planar upper surface can be formed by, for example, chemical-mechanical polishing or other planarization processes.

Figure 4:
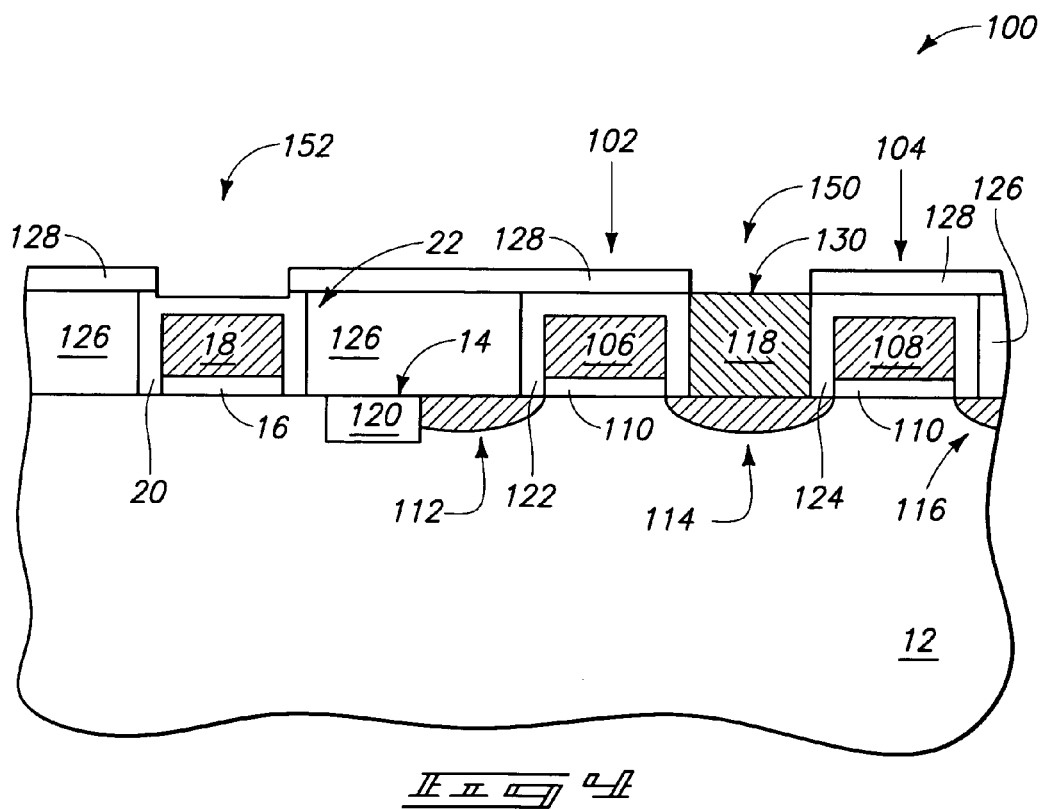
FIG. 4 is a view of the FIG. 3 wafer fragment shown at a processing stage subsequent to that of FIG. 3.

Referring to FIG. 4, an etch is utilized to form an opening 150 extending through electrically insulative layer 128 and to the upper surface 130 of pedestal 118. The etch is simultaneously utilized to form an opening 152 extending through insulative layer 128, and partially into cap 20. The specific locations of openings 150 and 152 can be defined with a patterned masking layer (not shown), such as, for example, patterned photoresist which is provided during the etch and subsequently removed. In particular aspects, layer 128 can consist essentially of, or consist of silicon dioxide; and cap 20 can consist essentially of, or consist of silicon nitride. In such aspects, the etch utilized to extend through layer 128 and partially into cap 20 can comprise $CF_4$ as a reactive etchant material. Particular etching conditions can utilize $CF_4$ at a flow rate of 90 standard cubic centimeters per minute (sccm) together with an inert gas (with the term "inert" indicating that the gas is inert relative to reaction with exposed materials of construction 100) provided at a flow rate of 20 sccm. An exemplary suitable inert gas is argon.

In the discussion that follows, the etch of FIG. 4 can be referred to as a first etch, to distinguish such etch from subsequent etches described below. Also, the depth to which opening 152 extends into cap 20 can be referred to as a first depth.

Figure 5:
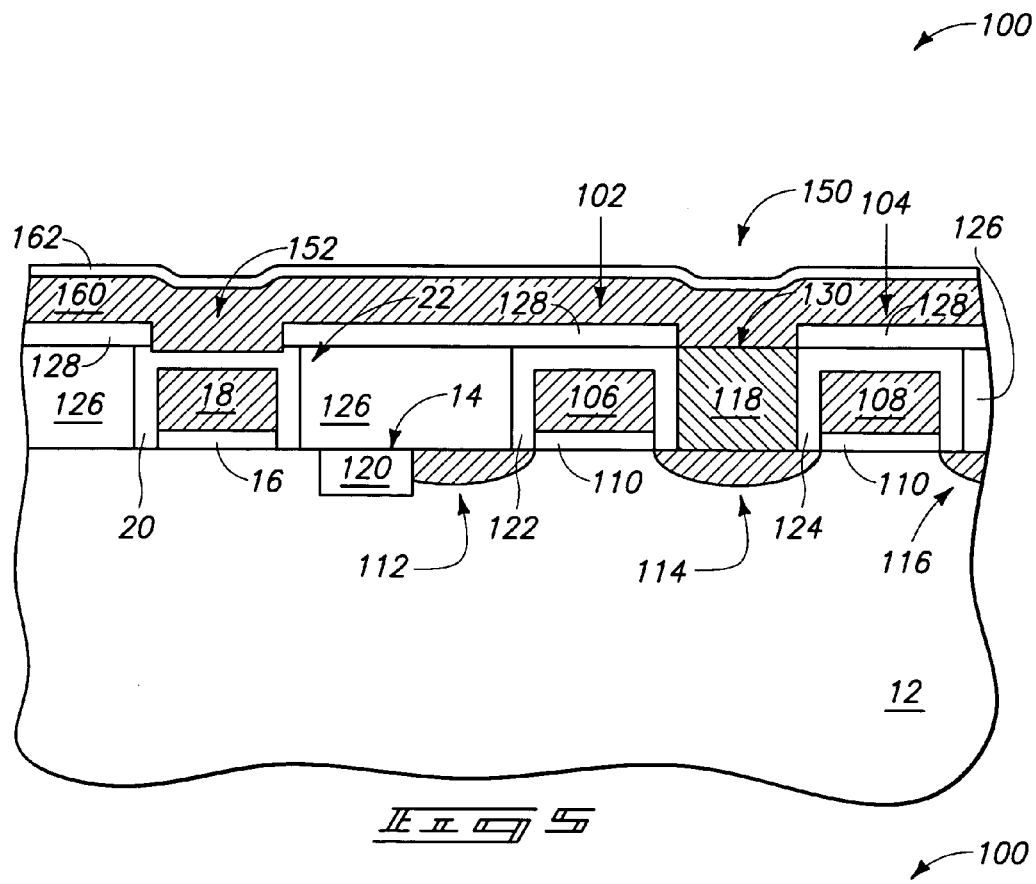
FIG. 5 is a view of the FIG. 3 wafer fragment shown at a processing stage subsequent to that of FIG. 4.

Referring to FIG. 5, a conductive mass 160 is formed over layer 128 and within openings 150 and 152. Mass 160 comprises one or more conductive materials, and in particular aspects can comprise, predominately comprise (by atomic percent), consist essentially of, or consist of tungsten. Mass 160 is ultimately patterned into a bitline in the shown exemplary aspect of the invention, and accordingly can comprise conventional materials suitable for incorporation in bitline constructions. Mass 160 is shown formed in electrical contact with pedestal 118, and specifically is shown formed directly against upper surface 130 of pedestal 118.

A protective insulative material 162 is formed over conductive mass 160. Insulative material 162 can comprise any suitable material, including, for example, silicon dioxide and/or silicon nitride.

Figure 6:
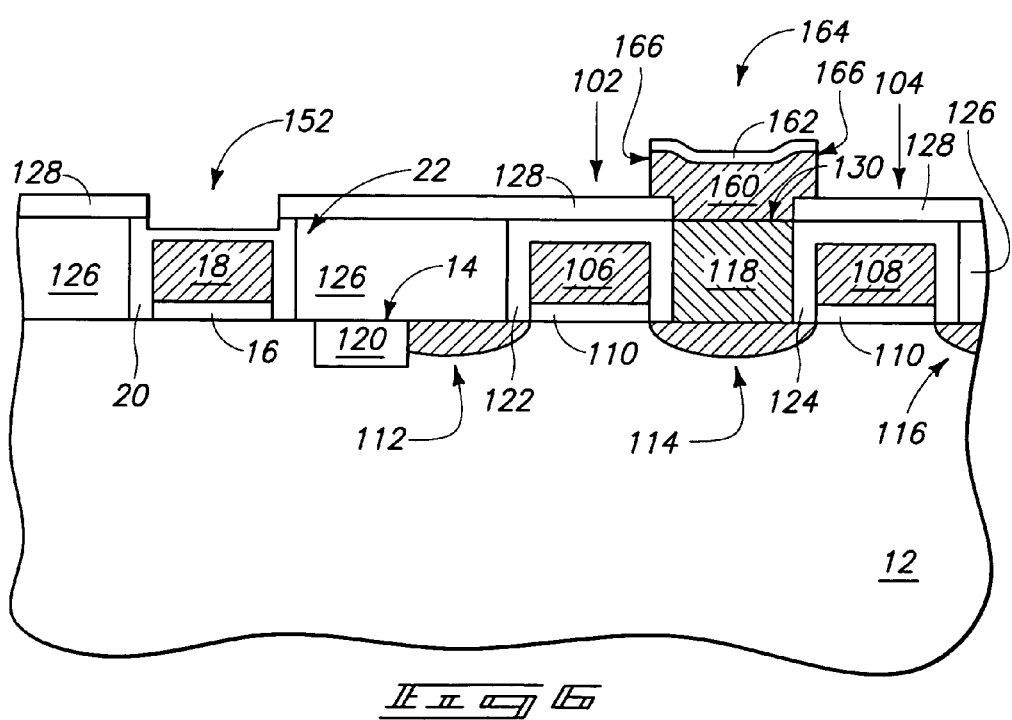
FIG. 6 is a view of the FIG. 3 wafer fragment shown at a processing stage subsequent to that of FIG. 5.

Referring to FIG. 6, materials 160 and 162 are patterned into a block 164 comprising sidewalls 166. In an exemplary aspect of the invention, material 160 can, as described above, be considered to be formed into a bitline. Accordingly, material 160 would be a line extending into and out of the page. Accordingly, the block 164 comprising materials 160 and 162 can be considered, in particular aspects of the invention, to correspond to a line.

The patterning of materials 160 and 162 can be accomplished by providing a patterned protective material (such as, for example, photolithographically patterned photoresist) over the region of materials 160 and 162 corresponding to block 164, subjecting materials 160 and 162 to a suitable etch to remove the portions of materials which are not covered by the protective mask, and subsequently removing the protective mask.

In particular aspects of the invention, the etch utilized for patterning materials 160 and 162 will also be utilized to extend opening 152 into cap 20. Accordingly, the depth of opening 152 at the processing stage of FIG. 6 can be deeper than the depth of opening 152 at the processing stage of FIG. 4, as shown. In particular aspects of the invention, electrically insulative material 162 will consist essentially of silicon nitride, conductive material 160 will consist essentially of tungsten and/or tungsten-containing compounds, and cap 20 will comprise silicon nitride. In such aspects, the etch utilized to pattern materials 160 and 162, and to simultaneously extend opening 152 into cap 20, can comprise an etch utilizing $Cl_2$, $NF_3$, and $CH_2F_2$. An exemplary etch can utilize a flow rate of $Cl_2$ of 10 sccm, a flow rate of $NF_3$ of 40 sccm, and a flow rate of $CH_2F_2$ of 12 sccm.

Referring to FIG. 7, an electrically insulative layer 170 is formed over block 164, and also within opening 152. Electrically insulative layer 170 can be referred to as a second electrically insulative layer to distinguish layer 170 from layer 128. Layer 170 can comprise, consist essentially of, or consist of, for example, silicon nitride.

Referring to FIG. 8, electrically insulative layer 170 is anisotropically etched to pattern layer 170 into spacers 172 along sidewalls 166 of block 164. In the shown aspect of the invention, the anisotropic etch of material 170 also patterns the material into spacers 174 within opening 152. Although spacers 174 appear separated from one another in the shown cross-sectional view, it is to be understood that the opening 152 can comprise a continuous periphery (for instance, opening 152 can comprise a circular shape when viewed from above), and accordingly the spacers 174 which appear separate from one another in the view of FIG. 8 could be part of a single spacer extending entirely around a continuous periphery of opening 152.

Spacers 174 narrow opening 152. The anisotropic etch utilized to form spacers 174 is shown extending into cap 20, and accordingly is shown extending opening 152 to a new depth which is deeper than the depth of opening 152 prior to the anisotropic etch. In particular aspects of the invention, insulative material 170 and cap 20 both consist essentially of silicon nitride. In such aspects, the anisotropic etch of material 170 can utilize, for example, $CF_4$. In particular aspects, the anisotropic etch can utilize a flow rate of $CF_4$ of 90 sccm, and a flow rate of argon of 20 sccm. The anisotropic etching conditions are preferably conducted for a sufficient time to extend a depth of opening 152 into cap 20, without extending the opening to an extent that the opening penetrates entirely through cap 20.

Although the illustrated processing forms spacers 174 within opening 152 from layer 170 (FIGS. 7 and 8), it is to be understood that the invention encompasses other processing in which spacers are not formed within opening 152. For instance, if sidewalls of opening 152 are not sufficiently vertical (which can occur, for example, if sidewall edges of layer 128 along opening 152 are not sufficiently vertical), layer 170 will be etched from within the opening rather than forming the shown spacers 174. The processing described below as occurring subsequent to formation of spacers 174 can also be conducted in the absence of spacers 174.

Figure 1:
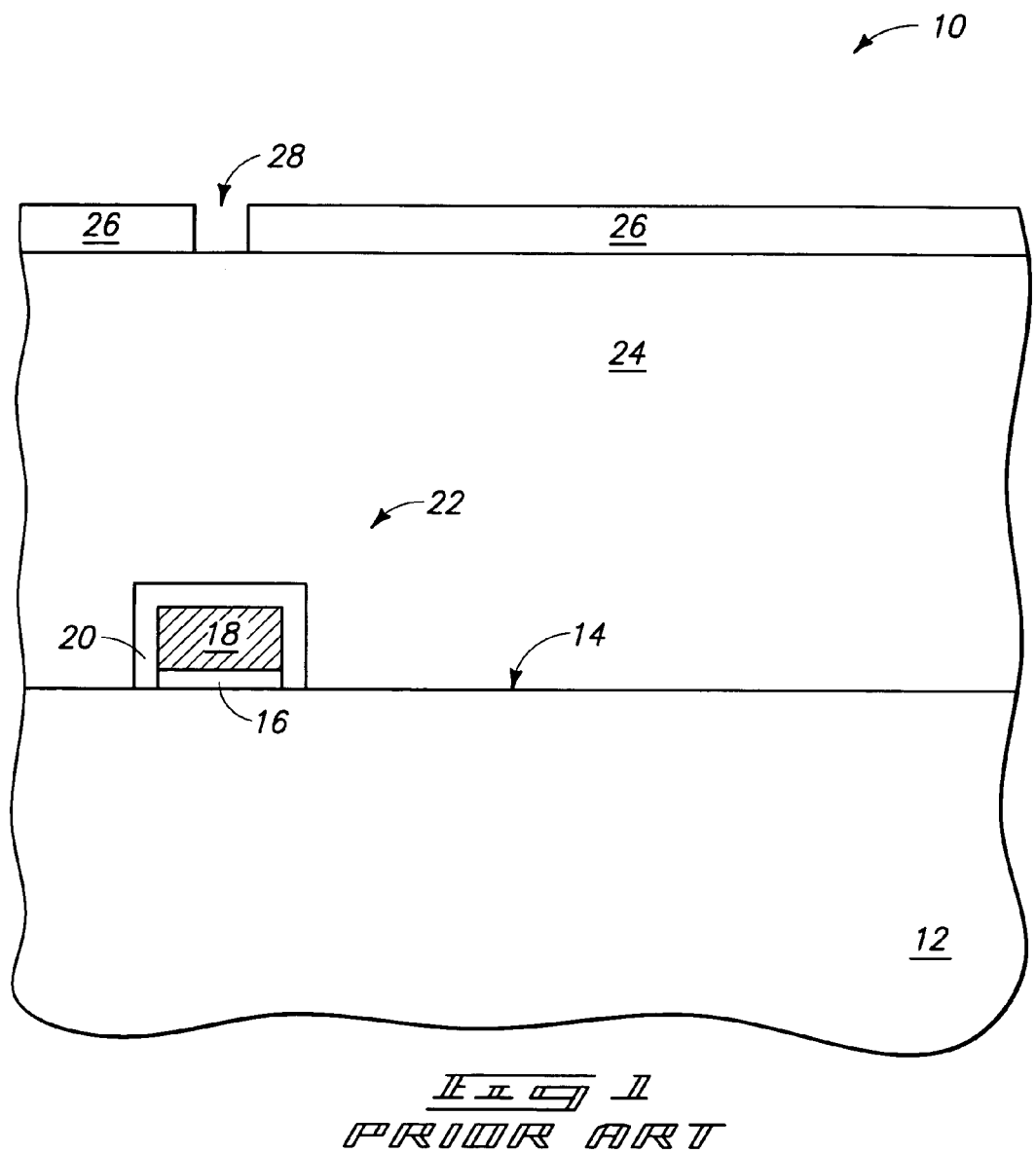
FIG. 1 is a diagrammatic, cross-sectional, fragmentary view of a semiconductor wafer construction shown at a preliminary processing stage of a prior art method.
Figure 9:
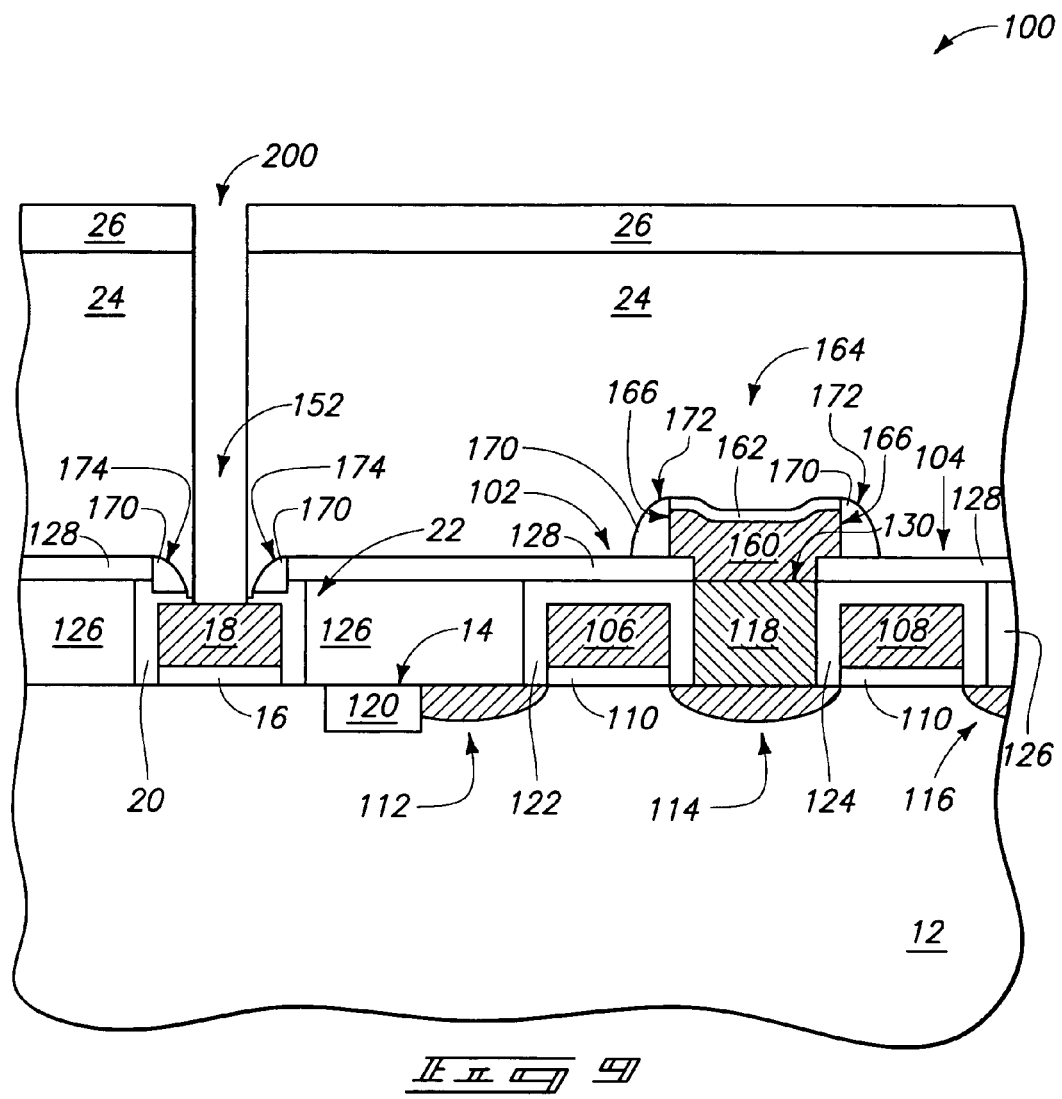
FIG. 9 is a view of the FIG. 3 wafer fragment shown at a processing stage subsequent to that of FIG. 8.

Referring to FIG. 9, a mass 24 of insulative material is formed over block 164 and over stack 22. Mass 24 can comprise one or more electrically insulative materials. Although the mass is shown as a homogeneous composition, it is to be understood that the mass can comprise layers of insulative materials, as described previously with reference to prior art FIG. 1. Mass 24 can have a thickness over stack 22 of at least about 10,000 Å, at least about 15,000 Å, or even at least about 20,000 Å. In particular aspects, mass 24 will comprise, consist essentially of, or consist of a silicate glass, such as, for example, BPSG.

A patterned masking layer 26 is formed over mass 24. Masking layer 26 can comprise, for example, photoresist, as discussed previously with reference to prior art FIG. 1. Patterned masking layer 26 defines an opening 200, which is extended through mass 24, through cap 22, and to conductive material 18. In the shown aspect of the invention, opening 200 extends between the spacers 174.

Figure 2:
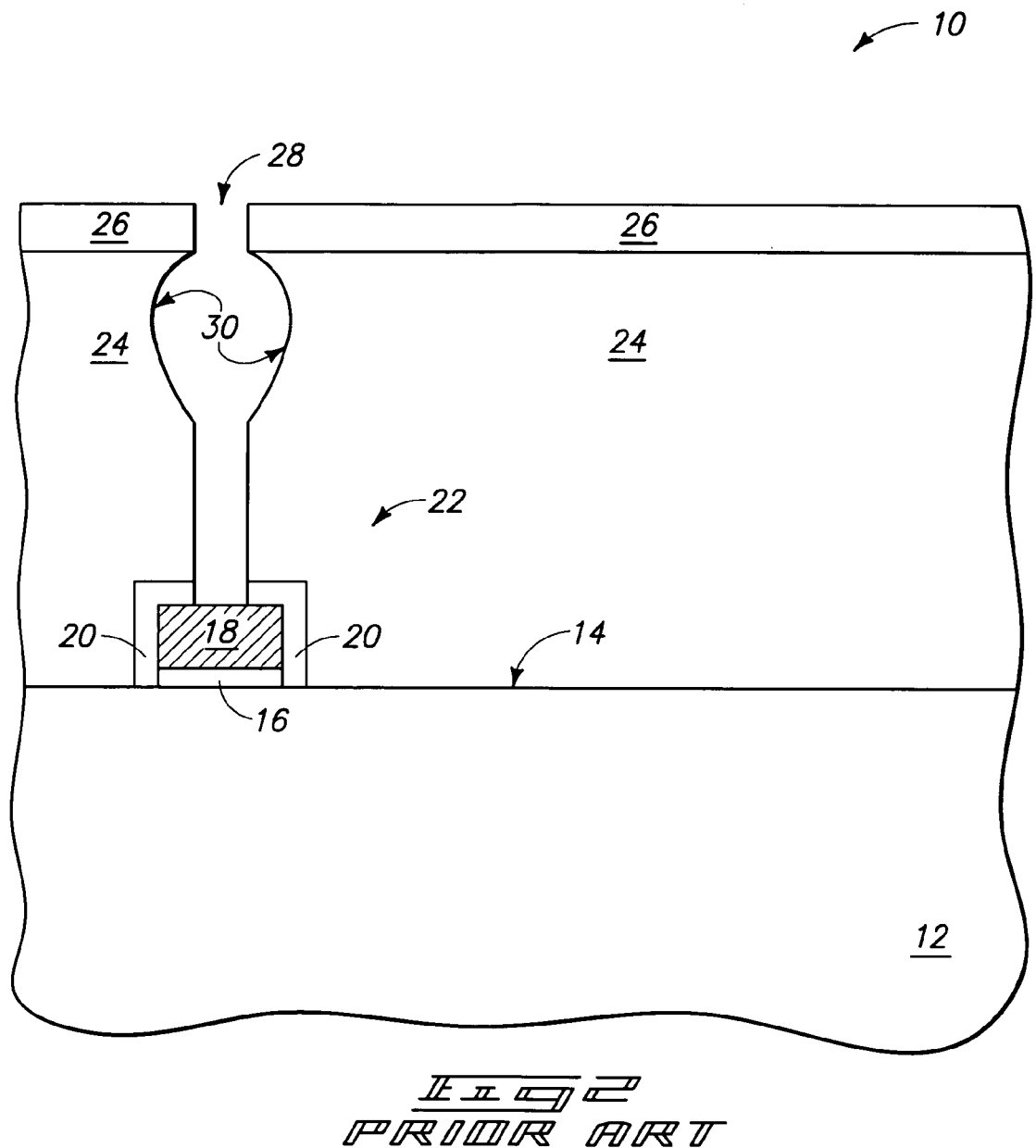
FIG. 2 is a view of the FIG. 1 wafer fragment shown at a prior art processing stage subsequent to that of FIG. 1.

Opening 200 differs from the prior art opening 28 (FIG. 2) in that the undesired widened portion 30 of the prior art construction is not present in the construction of FIG. 9. The thinning of the upper surface of cap 20 at the various processing stages of the present invention has reduced the time that it takes for an etch to penetrate cap 20 and reach conductive material 18, and has thus alleviated, and in particular aspects even prevented, formation of the undesired widened portion 30 (FIG. 2) which occurred in prior art processes.

In particular aspects of the invention, the etch utilized to form opening 200 can be considered a second etch, while the etch utilized to penetrate layer 128 (the etch described previously with reference to FIG. 4) can be considered a first etch. The second etch of FIG. 9 is separate from the first etch, in that the first etch has been stopped, and some intervening processing has occurred between the first etch and the second etch. In the exemplary shown aspect of the invention, the etch of FIG. 9 is actually the fourth etch in the series of etches progressing from the first etch of FIG. 4, the second etch of FIG. 6, the third etch of FIG. 8, and finally the fourth etch of FIG. 9.

Referring to FIG. 10, masking material 26 (FIG. 9) is removed, and a conductive interconnect 202 is formed within opening 200. Conductive interconnect 202 can comprise any suitable conductive material, including, for example, metals, metal compounds and/or conductively-doped silicon. In particular aspects of the invention, conductive material 18 is part of a wordline extending into and out of the shown cross-sectional view of construction 100. In such aspects, interconnect 202 can be utilized to connect the wordline to other circuitry (not shown).

Although the invention is described above with reference to a procedure of forming a single opening through an electrically insulative cap to a conductive material, it is to be understood that the invention can be utilized for simultaneously forming multiple openings extending through multiple insulative caps to multiple conductive lines, as well as for forming multiple openings extending through a single cap to a conductive line.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
a semiconductor substrate;
a stack supported by the semiconductor substrate; the stack comprising an electrically insulative cap over an electrically conductive material; the electrically insulative cap of the stack having a thin central region and a thicker peripheral region, the thin central region joining to the thicker peripheral region at a step;
an electrically conductive pillar supported by the semiconductor substrate, the pillar having an uppermost surface and a lateral periphery;
an electrically conductive cap on the electrically conductive pillar and having a lateral periphery extending outwardly beyond the lateral periphery of the electrically conductive pillar, the electrically conductive cap and electrically conductive pillar differing in composition relative to one another;
at least one first electrically insulative spacer along the step and at least one second electrically insulative spacer along the lateral periphery of the electrically conductive cap; the first and second electrically insulative spacers having the same composition as one another;
an electrically insulative material over the stack and over the electrically conductive cap; and
an electrical interconnect extending through the electrically insulative material to the electrically conductive material of the stack; the electrical interconnect extending through the thin central region of the electrically insulative cap.

2. The construction of claim 1 wherein the electrically conductive cap comprises tungsten and the electrically conductive pillar comprises conductively-doped silicon.

3. The construction of claim 1 wherein the first and second electrically insulative spacers comprise silicon nitride.

4. The construction of claim 1 wherein said step is a first step; wherein the thin central region of the electrically insulative cap comprises two thin regions joined to one another with a second step; wherein said two thin regions comprise a central-most region and an intermediate region; wherein the central-most region is thinner than the intermediate region; and wherein the electrical interconnect extends through an opening in the electrically insulative cap which is within a portion of the central-most region and not within the intermediate region.

5. The method of claim 1 wherein the conductive material of the stack is a part of a wordline and the electrically conductive cap is part of a bitline.

6. A semiconductor construction, comprising:
a semiconductor substrate;
a stack supported by the semiconductor substrate; the stack comprising an electrically insulative cap over an electrically conductive material; the electrically insulative cap of the stack having a thin central region and a thicker peripheral region, the thin central region joining to the thicker peripheral region at a step, said step being directly over the electrically conductive material of the stack;

an electrically conductive pillar supported by the semiconductor substrate, the pillar having an uppermost surface and a lateral periphery;

an electrically conductive cap on the electrically conductive pillar and having a lateral periphery extending outwardly beyond the lateral periphery of the electrically conductive pillar, the electrically conductive cap and electrically conductive pillar differing in composition relative to one another;

an electrically insulative material over the stack and over the electrically conductive cap; and an electrical interconnect extending through the electrically insulative material to the electrically conductive material of the stack; the electrical interconnect extending through the thin central region of the electrically insulative cap.

7. The construction of claim 6 wherein the electrically conductive cap comprises tungsten and the electrically conductive pillar comprises conductively-doped silicon.

8. The construction of claim 6 wherein the electrically insulative cap comprises silicon nitride.

9. The construction of claim 6 wherein the electrically insulative cap consists essentially of silicon nitride.

10. The construction of claim 6 wherein the electrically insulative cap consists of silicon nitride.

11. The construction of claim 6 further comprising at least one transistor gate between the conductive pillar and the stack.

12. The method of claim 6 wherein the conductive material of the stack is a part of a wordline and the electrically conductive cap is part of a bitline.

* * * * *

UNITED STATES PATENT AND TRADEMARK OFFICE
CERTIFICATE OF CORRECTION

PATENT NO. : 7,030,499 B2  Page 1 of 1
APPLICATION NO. : 10/999769
DATED : April 18, 2006
INVENTOR(S) : Michael J. Hermes It is certified that error appears in the above-identified patent and that said Letters Patent is hereby corrected as shown below:

Col. 2, line 4 –
　　Replace "shown), br, in other aspects (not shown) can be only over the"
　　Insert --shown), or, in other aspects (not shown) can be only over the--

Col. 8, line 58 –
　　Replace "The method of claim 1 wherein the conductive material"
　　Insert --The construction of claim 1 wherein the conductive material--

Col. 10, line 15 –
　　Replace "The method of claim 6 wherein the conductive"
　　Insert --The construction of claim 6 wherein the conductive--

Signed and Sealed this

Twenty-seventh Day of March, 2007

JON W. DUDAS
*Director of the United States Patent and Trademark Office*